United States Patent
Ochi et al.

[11] Patent Number: 6,164,357
[45] Date of Patent: Dec. 26, 2000

[54] APPARATUS FOR MANUFACTURING ADHESIVE LAYER, APPARATUS FOR MANUFACTURING DOUBLE-SIDED SUBSTRATE, AND APPARATUS FOR MANUFACTURING MULTI-LAYERED SUBSTRATE

[75] Inventors: Akio Ochi, Kyoto; Kanji Kato; Toshio Tanizaki, both of Osaka; Akira Wada, Kyoto; Hidenori Hayashi, Osaka, all of Japan

[73] Assignee: Matsushita Electric Industrial Co., Ltd., Osaka, Japan

[21] Appl. No.: 09/202,679

[22] PCT Filed: Apr. 24, 1998

[86] PCT No.: PCT/JP98/01903

§ 371 Date: Dec. 18, 1998

§ 102(e) Date: Dec. 18, 1998

[87] PCT Pub. No.: WO98/49877

PCT Pub. Date: Nov. 5, 1998

[30] Foreign Application Priority Data

Apr. 25, 1997 [JP] Japan ................................. 9-108805

[51] Int. Cl.⁷ ............................. B32B 31/16; B32B 31/20
[52] U.S. Cl. .................... 156/387; 156/498; 156/513; 156/514; 156/582; 156/583.1; 156/584; 118/50; 118/213
[58] Field of Search .................... 156/387, 388, 156/498, 510, 513, 514, 582, 583.1, 584; 118/50, 213; 361/748; 174/262, 264; 29/830, 852; 427/96, 97

[56] References Cited

U.S. PATENT DOCUMENTS 4,747,211  5/1988  Gilleo et al. .......................... 29/852
4,897,148  1/1990  Orlandi ............................... 156/510

FOREIGN PATENT DOCUMENTS

| 6-268345 | 9/1994 | Japan . |
| 7-147464 | 6/1995 | Japan . |
| 8-174792 | 7/1996 | Japan . |
| 8-222851 | 8/1996 | Japan . |
| 8-264943 | 10/1996 | Japan . |
| 9-83108 | 3/1997 | Japan . |
| 63-47991 | 2/1998 | Japan . |

*Primary Examiner*—Michael W. Ball
*Assistant Examiner*—Michael A Tolin
*Attorney, Agent, or Firm*—Pearne & Gordon LLP

[57] ABSTRACT

It is an object to provide an apparatus for manufacturing adhesive layers which can be manufactured in a manufacturing process which is fine, which exhibits an excellent mounting efficiency, which does not require a plating process and which is clean, double-sided substrates and multilayer substrates. A bonding-layer forming portion (5) incorporates a bonding portion (1), a hole machining portion (2), a charging portion (3) and a separating portion (4). A double-sided-substrate forming portion incorporates a bonding portion (6), a hole machining portion (7), a charging portion (8) and a separating portion (9), further incorporating a laminating portion (10), a resin hardening portion (11) and a pattern forming portion (12). The apparatus for manufacturing the multilayer substrate has a multilayer laminating portion (13), a resin hardening portion, a resin hardening portion (14) and an outer-layer-patter forming portion (15) to follow the bonding-layer forming portion (5) and the double-sided-substrate forming portion (16).

28 Claims, 9 Drawing Sheets

APPARATUS FOR MANUFACTURING ADHESIVE LAYER, APPARATUS FOR MANUFACTURING DOUBLE-SIDED SUBSTRATE, AND APPARATUS FOR MANUFACTURING MULTI-LAYERED SUBSTRATE

TECHNICAL FIELD

The present invention relates to an apparatus for manufacturing adhesive layers for use in double-sided substrates and multilayer substrates for use in a variety of electronic apparatuses, an apparatus for manufacturing the double-sided substrates and an apparatus for manufacturing the multilayer substrates.

BACKGROUND ART

Hitherto, an apparatus for manufacturing double-sided substrates and multilayer substrates for use in electronic apparatuses usually has a structure as shown in FIG. 12.

The apparatus incorporates a pattern forming portion 100 for forming a predetermined electrically-conductive patterns 108 and 109 on electrically-conductive foil 107 of a double-sided copper applied plate 106; a multilayer laminating portion 101 for bonding, through prepreg 111, another double-sided substrate or electrically-conductive foil 112 to the two sides of a double-sided substrate 110 formed by the pattern forming portion 100; a resin hardening portion 102 for hardening resin of the prepreg 111; a hole machining portion 103 for forming a hole 113 in a multilayer laminated substrate formed by the resin hardening portion 102; a through-hole plating portion 104 for forming an electrically-conductive layer 114 on the inner surface of the formed hole and the two sides of the multilayer laminated substrate; and an outer-layer-pattern forming portion 105 for forming a predetermined electrically-conductive pattern 115 on the outermost layer. After the above-mentioned processes have been performed, a predetermined multilayer substrate 116 can be manufactured.

However, the double-sided substrate and the multilayer substrate must be finer substrates exhibiting a raised mounting efficiency. Also from another viewpoint of the environment, an apparatus for manufacturing double-sided substrates, that for manufacturing multilayer substrates and that for manufacturing adhesive layers for the foregoing substrates have been required such that each apparatus does not require a plating process.

An object of the present invention is to provide an apparatus for manufacturing adhesive layers which are finer, which exhibit an excellent mounting efficiency, which do not require any plating process and which are manufactured by clean manufacturing processes, an apparatus for manufacturing double-sided substrates and an apparatus for manufacturing multilayer substrates.

DISCLOSURE OF THE INVENTION

An apparatus for manufacturing an adhesive layer according to the present invention comprises: a bonding portion for bonding a film member to prepreg; a hole machining portion for forming a hole at a predetermined position of a laminate composed of the prepreg and the film member; a charging portion for charging electrically-conductive paste into the formed hole of the laminate composed of the prepreg and the film member; and a separating portion for separating the film member from the laminate having the hole into which the electrically-conductive paste has been charged.

As a result of the above-mentioned structure, a fine manufacturing process can be provided which exhibits an excellent mounting efficiency and which does not require any plating process.

BEST MODE FOR CARRYING OUT THE INVENTION

Figure 1:
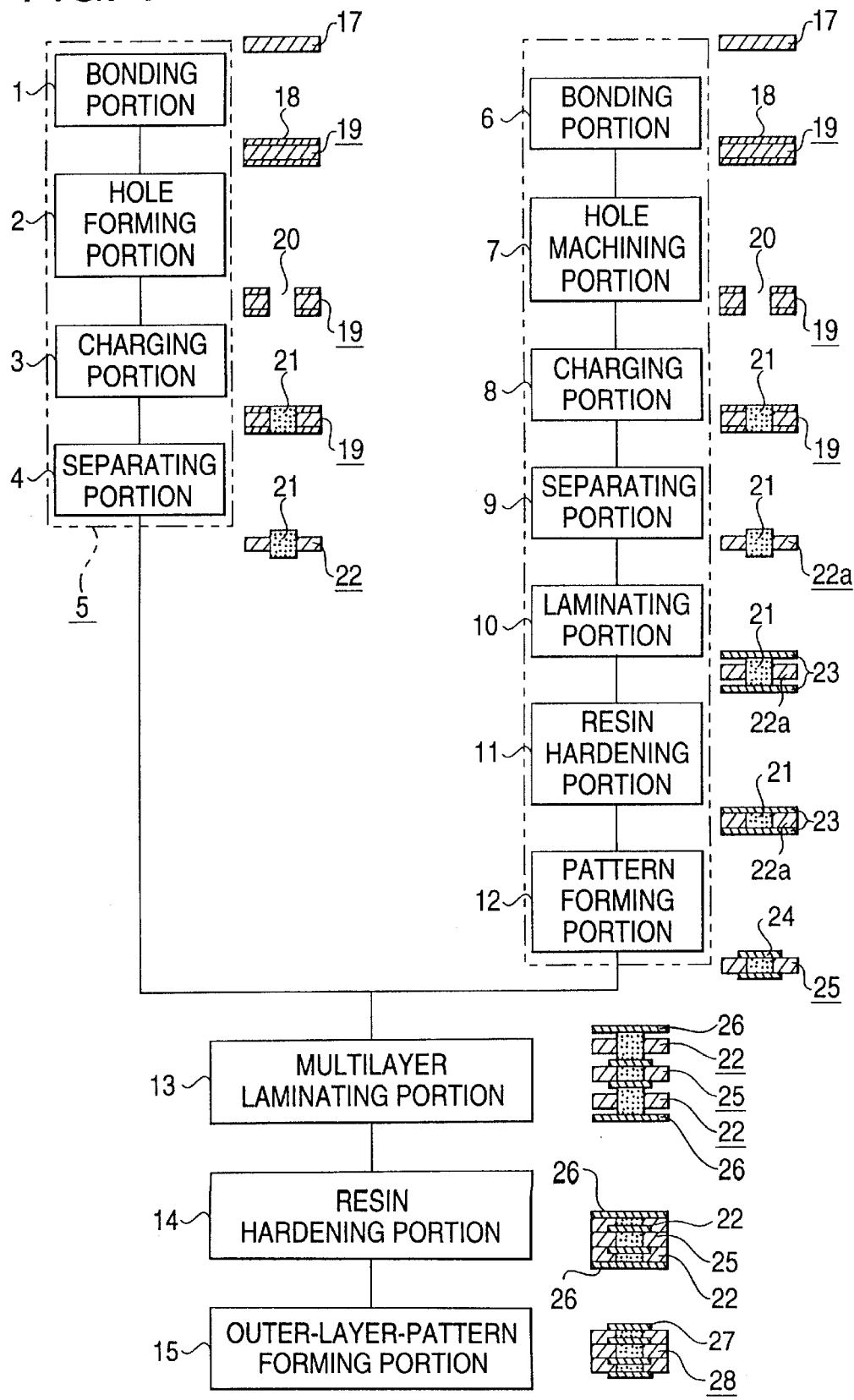
FIG. 1 is a diagram showing the overall process of a first embodiment of an apparatus for manufacturing adhesive layers, double-sided substrates and multilayer substrates according to the present invention.

According to an aspect of the present invention an apparatus for manufacturing an adhesive layer includes a bonding portion for bonding a film member to prepreg; a hole machining portion for forming a hole at a predetermined position of a laminate composed of the prepreg and the film member; a charging portion for charging electrically-conductive paste into the formed hole in the laminate which is composed of the prepreg and the film member; and a separating portion for separating the film member from the laminate having the hole into which the electrically-conductive paste has been charged. Therefore, an effect can be obtained in that a fine and clean manufacturing process which does not require a plating process can be realized.

According to another aspect of the present invention, the bonding portion incorporates a Preheating portion for preheating the prepreg and the film member, a heating portion for bonding the prepreg and the film member to each other and a cooling portion for cooling and securing the prepreg and the film member. Therefore, the film ember can quickly be bonded at low temperatures. Moreover, the film member can sufficiently be cooled and secured so that an effect is obtained in that change in the dimensions of the laminate composed of the prepreg and the film member can be stabilized.

In accordance with another feature of the present invention, the bonding portion incorporates a separation-start forming portion for separating a portion of a side of the film member from the laminate composed of the prepreg and the film member so as to form a non-bonded portion. Therefore, an effect can be obtained in that when the film member is separated from the laminate by the following separating portion, the film member can reliably be held.

In accordance with another feature of the present invention, the bonding portion incorporates a cutting portion for cutting the laminate into sheets after the prepreg and the film member have been boded to each other. Therefore, an effect can be obtained in that a sheet process is enabled in the following process.

In accordance with another feature of the present invention, the bonding portion incorporates, in the final portion thereof, an end-surface cutting portion for cutting a portion of an end surface of the laminate composed of the prepreg and the film member. Therefore, an effect can be obtained in that an accuracy to align the position of the laminate in a following process can be improved.

In accordance with another feature of the present invention, the charging portion incorporates a squeegee and a thin-plate-like frame portion for holding the periphery of the laminate. Therefore, an effect can be obtained in that the electrically-conductive paste does not adhere to the laminate in a period except for a charging process.

In accordance with another feature of the present invention, the charging portion incorporates a printing bed which is capable of performing vacuum adsorption and a sheet conveying portion for conveying the laminate placed through a gas-permeable sheet on the printing bed by conveying the gas-permeable sheet. Therefore, an effect can be obtained in that the charged electrically-conductive paste can be conveyed while the electrically-conductive paste is held between the hole in the laminate and the gas-permeable sheet.

In accordance with another feature of the present invention, the charging portion incorporates a shearing and separating portion for shearing and separating the laminate in a state in which the contact surfaces of the laminate and the gas-permeable sheet are maintained. Therefore, an effect can be obtained in that adhesion of the electrically-conductive paste to the gas-permeable sheet can be minimized.

In accordance with another feature of the present invention, the separating portion for separating the film member from the laminate having the hole into which the electrically-conductive paste has been charged incorporates a heating portion. Therefore, an effect can be obtained in that the viscosity of the resin of the laminate can be lowered and the film member can easily be separated in the following separating portion.

In accordance with another feature of the present invention, an apparatus for manufacturing an adhesive layer includes a holding frame for alternately stacking the laminates each having the hole into which the electrically-conductive paste has been charged or the adhesive layers each of which is obtained by separating the film member from the laminate having the hole into which the electrically-conductive paste has been charged so as to hold and convey the laminates or the adhesive layers. Therefore, an effect can be obtained in that the electrically-conductive paste having viscosity can be held and conveyed while undesirable contact with another element is prevented.

In accordance with another feature of the present invention, an apparatus for manufacturing a double-sided substrate, comprises a bonding portion for bonding a film member to prepreg; a hole machining portion for forming a hole at a predetermined position of a laminate composed of the prepreg and the film member; a charging portion for charging electrically-conductive paste into the formed hole in the laminate which is composed of the prepreg and the film member; a separating portion for separating the film member from the laminate having the hole into which the electrically-conductive paste has been charged; a laminating portion for laminating electrically-conductive foil to two sides of the adhesive layer from which the film member has been separated; a resin hardening portion for hardening resin of the adhesive layer; and a pattern forming portion for forming a predetermined electrically-conductive patter on the electrically-conductive foil. Thus, an effect can be obtained in that a fine and clean manufacturing process can be realized which exhibits an excellent manufacturing efficiency and which does not require a plating process.

In accordance with another feature of the present invention the bonding portion incorporates a preheating portion for preheating the prepreg and the film member, a heating portion for bonding the prepreg and the film member to each other and a cooling portion for cooling and securing the prepreg and the film member. Therefore, the film member can quickly be bonded at low temperatures. Moreover, the film member can sufficiently be cooled and secured so that an effect is obtained in that change in the dimensions of the laminate composed of the prepreg and the film member can be stabilized.

In accordance with another feature of the present invention, the bonding portion incorporates a separation-start forming portion for separating a portion of a side of the film member from the laminate composed of the prepreg and the film member so as to form a non-bonded portion. Therefore, an effect can be obtained in that when the film member is separated from the laminate by the following separating portion, the film member can reliably be held.

In accordance with another feature of the present invention, the bonding portion incorporates a cutting portion for cutting the laminate into sheets after the prepreg and the film member have been boded to each other. Therefore, an effect can be obtained in that a sheet process is enabled in the following process.

Another aspect claimed in claim 15 of the present invention has a structure according to claim 11, in which the bonding portion incorporates, in the final portion thereof, an end-surface cutting portion for cutting a portion of an end surface of the laminate composed of the prepreg and the film member. Therefore, an effect can be obtained in that an accuracy to align the position of the laminate in a following process can be improved.

Another aspect claimed in claim 16 of the present invention has a structure according to claim 11, in which the charging portion incorporates a squeegee and a thin-plate-like frame portion for holding the periphery of the laminate. Therefore, an effect can be obtained in that the electrically-conductive paste does not adhere to the laminate in a period except for a charging process.

Another aspect claimed in claim 17 of the present invention has a structure according to claim 11, in which the charging portion incorporates a printing bed which is capable of performing vacuum adsorption and a sheet conveying portion for conveying the laminate placed through a gas-permeable sheet on the printing bed by conveying the gas-permeable sheet. Therefore, an effect can be obtained in that the charged electrically-conductive paste can be conveyed while the electrically-conductive paste is held between the hole in the laminate and the gas-permeable sheet.

In accordance with another feature of the present invention, the charging portion incorporates a shearing and separating portion for shearing and separating the laminate in a state in which the contact surfaces of the laminate and the gas-permeable sheet are maintained. Therefore, an effect can be obtained in that adhesion of the electrically-conductive paste to the gas-permeable sheet can be minimized.

In accordance with another feature of the present invention, the separating portion for separating the film member from the laminate having the hole into which the electrically-conductive paste has been charged incorporates a heating portion. Therefore, an effect can be obtained in that the viscosity of the resin of the laminate can be lowered and the film member can easily be separated in the following separating portion.

In accordance with another feature of the present invention, a holding frame is provided for alternately stacking the laminates each having the hole into which the electrically-conductive paste has been charged or the adhesive layers each of which is obtained by separating the film member from the laminate having the hole into which the electrically-conductive paste has been charged so as to hold and convey the laminates or the adhesive layers. Therefore, an effect can be obtained in that the electrically-conductive paste having viscosity can be held and conveyed while undesirable contact with another element is prevented.

In accordance with another feature of the present invention, a drying portion is provided for removing water from the adhesive layer from which the film member has been separated. Therefore, an effect can be obtained in that water which causes interlayer separation to take place when the resin is hardened in the following process is removed.

In accordance with another feature of the present invention, the laminating portion has a moisture preventive portion for causing the adhesive layer, from which the film member has been separated, not to absorb moisture. Therefore, an effect can be obtained in that water which causes interlayer separation to take place when the resin is hardened in the following process is removed.

In accordance with another feature of the present invention, there is provided an apparatus for manufacturing a multilayer substrate, comprising: a double-sided-substrate forming portion incorporating a bonding portion for bonding a film member to prepreg, a hole machining portion for forming a hole at a predetermined position of a laminate composed of the prepreg and the film member, a charging portion for charging electrically-conductive paste into the formed hole in the laminate which is composed of the prepreg and the film member, a separating portion for separating the film member from the laminate having the hole into which the electrically-conductive paste has been charged, a laminating portion for laminating electrically-conductive foil to two sides of the adhesive layer from which the film member has been separated; a resin hardening portion for hardening resin of the adhesive layer, and a pattern forming portion for forming a predetermined electrically-conductive patter on the electrically-conductive foil; a multilayer-substrate forming portion for bonding other double-sided substrates or electrically-conductive foil to the two sides of the double-sided substrate through the adhesive layers; a resin hardening portion for hardening resin of the adhesive layer; and an outer-later-pattern forming portion for forming a predetermined electrically-conductive pattern on the electrically-conductive foil bonded to the outermost layer. Therefore, an effect can be obtained in that a fine and clean manufacturing process which does not require a plating process can be realized.

In accordance with another feature of the present invention, the bonding portion incorporates a preheating portion for preheating the prepreg and the film member, a heating portion for bonding the prepreg and the film member to each other and a cooling portion for cooling and securing the prepreg and the film member. Therefore, the film member can quickly be bonded at low temperatures. Moreover, the film member can sufficiently be cooled and secured so that an effect is obtained in that change in the dimensions of the laminate composed of the prepreg and the film member can be stabilized.

In accordance with another feature of the present invention, the bonding portion incorporates a separation-start forming portion for separating a portion of a side of the film member from the laminate composed of the prepreg and the film member so as to form a non-bonded portion. Therefore, an effect can be obtained in that when the film member is separated from the laminate by the following separating portion, the film member can reliably be held.

In accordance with another feature of the present invention, the bonding portion incorporates a cutting portion for cutting the laminate into sheets after the prepreg and the film member have been boded to each other. Therefore, an effect can be obtained in that a sheet process is enabled in the following process.

In accordance with another feature of the present invention, the bonding portion incorporates, in the final portion thereof, an end-surface cutting portion for cutting a portion of an end surface of the laminate composed of the prepreg and the film member. Therefore, an effect can be obtained in that an accuracy to align the position of the laminate in a following process can be improved.

In accordance with another feature of the present invention, the charging portion incorporates a squeegee and a thin-plate-like frame portion for holding the periphery of the laminate. Therefore, an effect can be obtained in that the electrically-conductive paste does not adhere to the laminate in a period except for a charging process.

In accordance with another feature of the present invention, the charging portion incorporates a printing bed which is capable of performing vacuum adsorption and a sheet conveying portion for conveying the laminate placed through a gas-permeable sheet on the printing bed by conveying the gas-permeable sheet. Therefore, an effect can be obtained in that the charged electrically-conductive paste can be conveyed while the electrically-conductive paste is held between the hole in the laminate and the gas-permeable sheet.

In accordance with another feature of the present invention, the charging portion incorporates a shearing and separating portion for shearing and separating the laminate in a state in which the contact surfaces of the laminate and the gas-permeable sheet are maintained. Therefore, an effect can be obtained in that the charged electrically-conductive paste can be conveyed while the electrically-conductive paste is held between the hole in the laminate and the gas-permeable sheet.

In accordance with another feature of the present invention, the separating portion for separating the film member from the laminate having the hole into which the electrically-conductive paste has been charged incorporates a heating portion. Therefore, an effect can be obtained in that the viscosity of the resin of the laminate can be lowered and the film member can easily be separated in the following separating portion.

In accordance with another feature of the present invention, a holding frame is provided for alternately stacking the laminates each having the hole into which the electrically-conductive paste has been charged or the adhesive layers each of which is obtained by separating the film member from the laminate having the hole into which the electrically-conductive paste has been charged so as to hold and convey the laminates or the adhesive layers. Therefore, an effect can be obtained in that the electrically-conductive paste having viscosity can be held and conveyed while undesirable contact with another element is prevented.

In accordance with another feature of the present invention, for removing water from the adhesive layer from which the film member has been separated or the double-sided substrate. Therefore, an effect can be obtained in that water which causes interlayer separation to take place when the resin is hardened in the following process is removed.

In accordance with another feature of the present invention, the laminating portion or the multilayer laminating portion has a moisture preventive portion for causing the adhesive layer, from which the film member has been separated, or the double-sided substrate not to absorb moisture. Therefore, an effect can be obtained in that water which causes interlayer separation to take place when the resin is hardened in the following process is removed.

First Embodiment

Referring to FIG. 1, an adhesive-layer forming portion 5 forms and supplies an adhesive layer 22 which constitutes a multilayer substrate, the adhesive-layer forming portion 5 incorporating a bonding portion 1, a hole machining portion 2, a charging portion 3 and a separating portion 4.

In the bonding portion 1, film members 18 made of polyethylene terephthalate (hereinafter called "PET"), paper or polyimde or their combination are bonded to prepreg 17 made of epoxy glass, epoxy aramide or epoxy paper by heat welding or ultraviolet-ray hardening. Thus, a laminate 19 is formed.

Then, in the hole machining portion 2, a predetermined number of holes 20 are formed at predetermined positions of the laminate 19 composed of the prepreg 17 and the film members 18 by a laser beam or a drill.

Then, electrically-conductive paste 21 is, by a means, for example, a squeegee, is charged into the holes 20 in the laminate 19 by the charging portion 3. Then, the film members 18 are, in the separating portion 4, separated from the laminate 19 so that the adhesive layer 22 is formed.

A double-side-substrate forming portion 16 arranged to perform an individual process is structured to form and supply a double-sided substrate 25. The double-side-substrate forming portion 16 incorporates a laminating portion 10, a resin hardening portion 11 and a pattern forming portion 12 which are added to a bonding portion 6, the hole machining portion 7, the charging portion 8 and the separating portion 9 structured similarly to those in the adhesive-layer forming portion 5.

An adhesive layer 22a is formed by a process which is the same as that performed in the adhesive-layer forming portion 5 such that the laminating portion 10 laminates electrically-conductive foil 23, such as copper foil, onto the two sides of the adhesive layer 22a. The resin hardening portion 11 performs heating and pressing, by means of heat press or the like, so that the resin of the prepreg 17 of the adhesive layer 22a is hardened. Thus, the prepreg 17 is firmly joined to the electrically-conductive foil 23.

Then, the pattern forming portion 12 forms a predetermined electrically-conductive pattern 24 on the electrically-conductive foil 23 by etching or the like so that a predetermined double-sided substrate 25 is formed.

An apparatus for manufacturing a multilayer substrate incorporates the adhesive-layer forming portion 5 and the double-side-substrate forming portion 16. In addition, a multilayer laminating portion 13, a resin hardening portion 14 and an outer-layer-pattern forming portion 15 are added to follow the above-mentioned portions. The multilayer laminating portion 13 bonds electrically-conductive foil 26, such as copper foil, to the two sides of the double-sided substrate 25 through the adhesive layers 22.

Then, the resin hardening portion 14 performs a heat press or the like to perform heating and pressing so that the resin of the prepreg of the adhesive layers 22 is hardened. Thus, the adhesive layers 22 are firmly bonded to the electrically-conductive foil 26.

Then, the outer-layer-pattern forming portion 15 forms a predetermined electrically-conductive pattern 27 on the electrically-conductive foil 26 by etching or the like so that a predetermined multilayer substrate 28 is formed.

Figure 2:
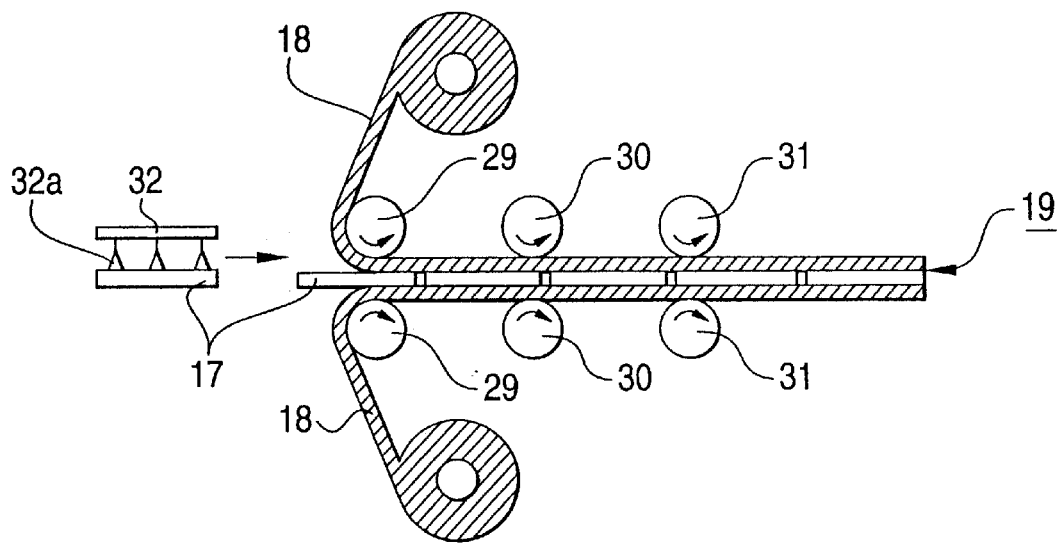
FIG. 2 is a diagram showing the structure of a bonding portion according to the first embodiment of the present invention.

FIG. 2 shows the structure of an essential portion of the bonding portion 1 which incorporates a pair of rotative preheating rollers 29, a pair of rotative bonding rollers 30, a pair of rotative cooling rollers 31 and an injection loading 32 provided with an absorber 32a and arranged to perform conveyance and insertion.

The pair of the preheating rollers 29 and the pair of the bonding rollers 30 are heated to 80° C. to 160° C. by a heater incorporating nichrome wire or a heating means using electromagnetic induction and rotated at predetermined speed in opposite directions.

The film members 18 made of PET, paper or polyimde or their combination are supplied and allowed to pass through between the pairs of the above-mentioned rollers which are disposed vertically. The prepreg 17 made of epoxy glass, epoxy aramide or paper epoxy is conveyed and injected between the film members 18 by the injection loading 32.

The prepreg 17 and the film members 18 are preheated by the preheating rollers 29, and then heated and pressed by the bonding rollers 30 so as to be bonded to each other. Then, the prepreg 17 and the film members 18 are cooled and secured before and after passage through the pair of the cooling rollers 31.

Since the bonding rollers 30 has previously been heated by the preheating rollers 29, the bonding rollers 30 are able to quickly perform bonding even at relatively low temperatures.

Since tension control (not shown) of the film members 18 is performed in such a manner that a predetermined tension is always applied to the film members 18, the predetermined tension is applied to the prepreg 17 in a period from heating to cooling and fixing. As a result, change in the dimensions of the laminate 19 can be stabilized. Moreover, creases and waviness can be prevented.

In place of the cooling rollers 31, a cooling space for air cooling may be employed. In place of the preheating rollers 29, a contact and stationary means, such as a heater plate or a non-contact heating means, such as an infrared-ray heater, may be employed.

A heat press or the like may be employed to heat and press the prepreg 17 and the film members 18 so as to bond the prepreg 17 and the film members 18.

Figure 3A:
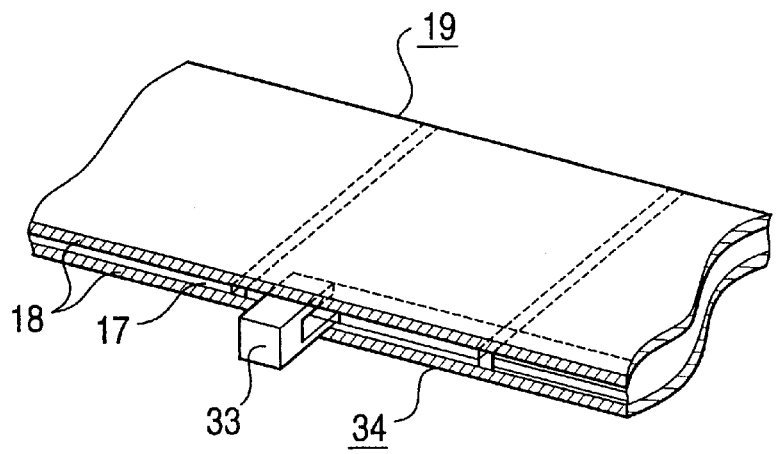
FIG. 3(a) is a perspective view showing a separation-start forming portion of the bonding portion according to the first embodiment of the present invention.

FIG. 3(a) shows a separation-start forming portion of the bonding portion 1. A blade 33 made of steel of a metal member and formed into a U-shape facing side is inserted between either portion of the prepreg 17 and the film member 18 of the laminate 19 which has successively been conveyed. Thus, a non-bonded portion 34 of the laminate 19 is formed.

Figure 3B:
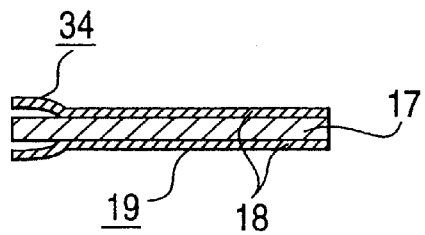
FIG. 3(b) is a cross sectional view showing a laminate formed by the separation-start forming portion.

FIG. 3(b) shows the cross section of the laminate 19 having the non-bonded portion 34 formed thereon. Since the film members 18 are, in the non-bonded portion 34, separated from the prepreg 17, the film members 18 in the non-bonded portion 34 can easily be held when the following separating portion separates the film members 18 from the laminate 19. Therefore, the film members 18 can reliably be separated.

A groove (not shown) may be formed in a portion of each of the bonding rollers 30 to form a portion which does not heat and press the prepreg 17 and the film members 18 so as to form the non-bonded portion 34.

If the laminate 19 is drawn by, for example, rollers having knurls (not shown), the non-bonded portion 34 can be formed.

Figure 4A:
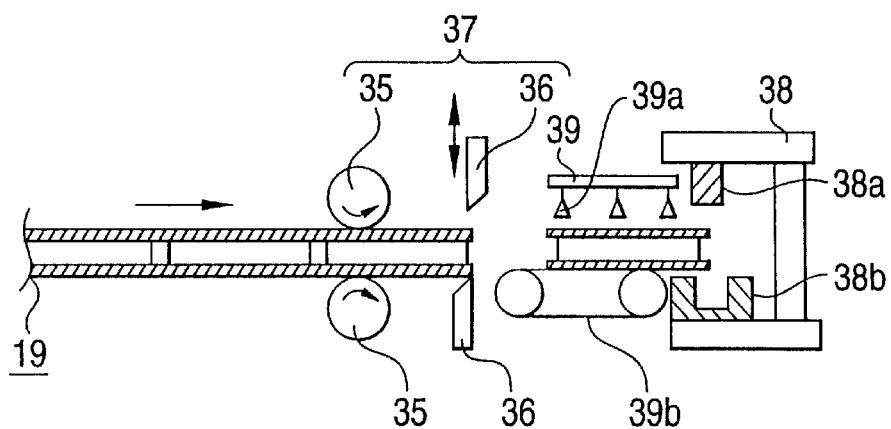
FIG. 4(a) is a diagram showing the structures of a cutting portion and an end-surface cutting portion according to the first embodiment of the present invention.
Figure 4B:
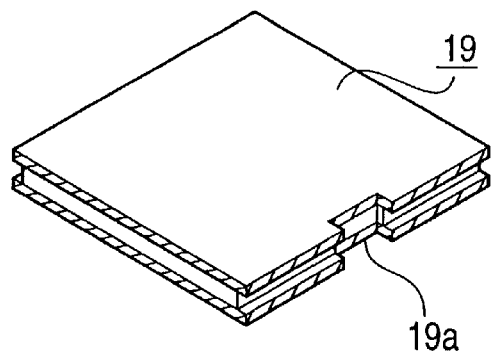
FIG. 4(b) is a perspective view showing a laminate formed by the cutting portion and the end-surface cutting portion.

FIG. 4(a) shows the structure of essential portions of a cutting portion 37 and an end-surface cutting portion 38 of the bonding portions 1 and 6. A pair of rotative feeding rollers 35 moves and stops the laminate 19. A cutting blade 36 which is able to vertically move cuts the laminate 19 when the rotation of the feeding rollers 35 is stopped. Then, the laminate 19 is conveyed by a conveying unit 39b, such as a belt conveyor. Then, an end-surface cutting portion 38 composed of a punch 38a and a die 38b cuts a portion of an end surface of the laminate 19, as shown in FIG. 4(b), so that a cut portion 19a is formed.

Finally, a movable ejection loading 39 having an absorber 39a and so forth and arranged to convey and insert the laminate 19 is used to extract the laminate 19. Thus, the operation of the bonding portion 1 is completed.

Figure 4C:
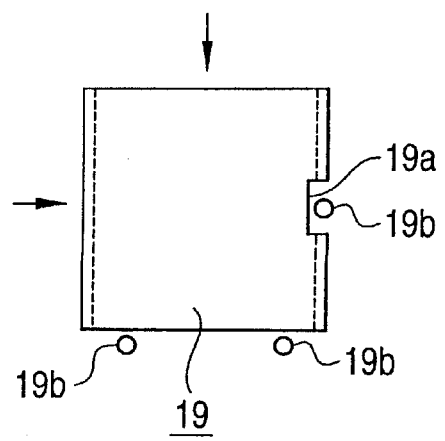
FIG. 4(c) is a top view showing a state of use of the laminate.

When the laminate 19 is located in the following process as shown in FIG. 4(c), the locating operation is commonly performed by bringing a pin 19b or the like into contact with the cut portion 19a. Thus, the locating accuracy can be improved.

The cutting portion 37 cuts the laminate 19 into sheets. The sheet process can be performed in the following process, thus causing advantages to be realized in that the type of the product can easily be changed and small-size lot can easily be manufactured.

Figure 4D:
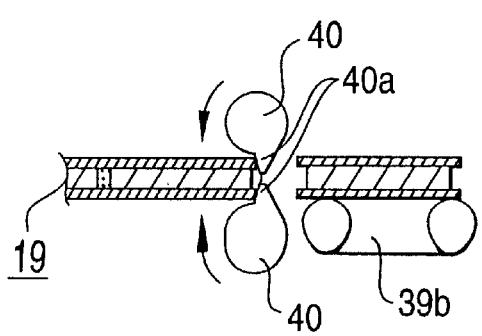
FIG. 4(d) is a diagram showing another structure of the cutting portion of the bonding portion.

To cause the cutting blade 36 to cut the laminate 19, the feeding roller 35 are turned on and stopped. If a pair of rotary cutters 40 each having a rotative cutting blade 40a formed on the outer periphery thereof is operated as shown in FIG. 4(d), the laminate 19 in a continuously conveyed state can be cut.

Figure 5:
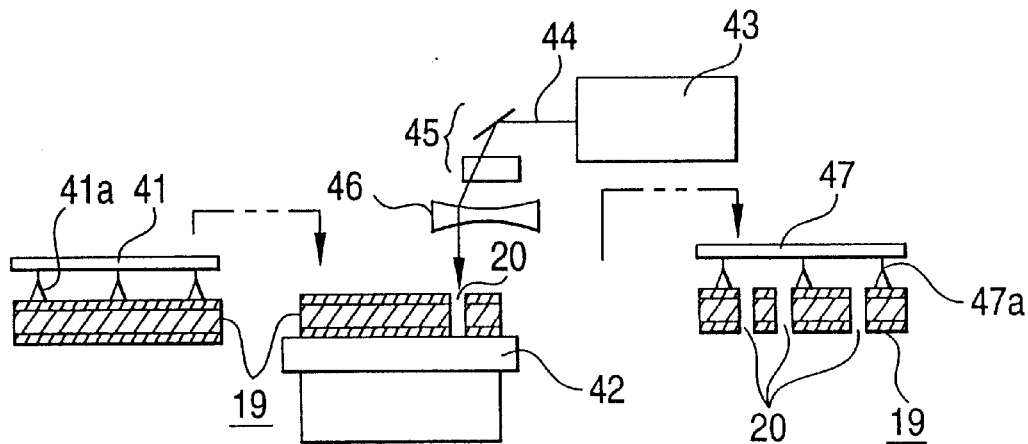
FIG. 5 is a diagram showing the structure of a hole machining portion according to the first embodiment of the present invention.

FIG. 5 shows the structures of essential portions of the hole machining portions 2 and 7. A movable injection loading 41 having an absorber 41a and so forth and structured to convey and insert the laminate 19 places the laminate 19 on the upper surface of an XY-table 42.

On the other hand, a laser beam 44 emitted from a laser oscillator 43 is divided to predetermined positions in the movable range of a galvano mirror 45. Then, the laser beam 44 is converged by an fθ-lens 46 so as to be applied to a predetermined position on the laminate 19 so that the hole 20 is formed.

When the process for forming the hole in the movable range for the galvano mirror 45 has been completed, the XY-table 42 is moved to sequentially perform the process for forming a predetermined number of the holes 20 in the overall surface of the laminate 19 in a stepped manner. Finally, a movable ejection loading 47 having an absorber 47a and so forth and structured to convey and insert the laminate 19 extracts the laminate 19 from the XY-table 42.

Figure 6:
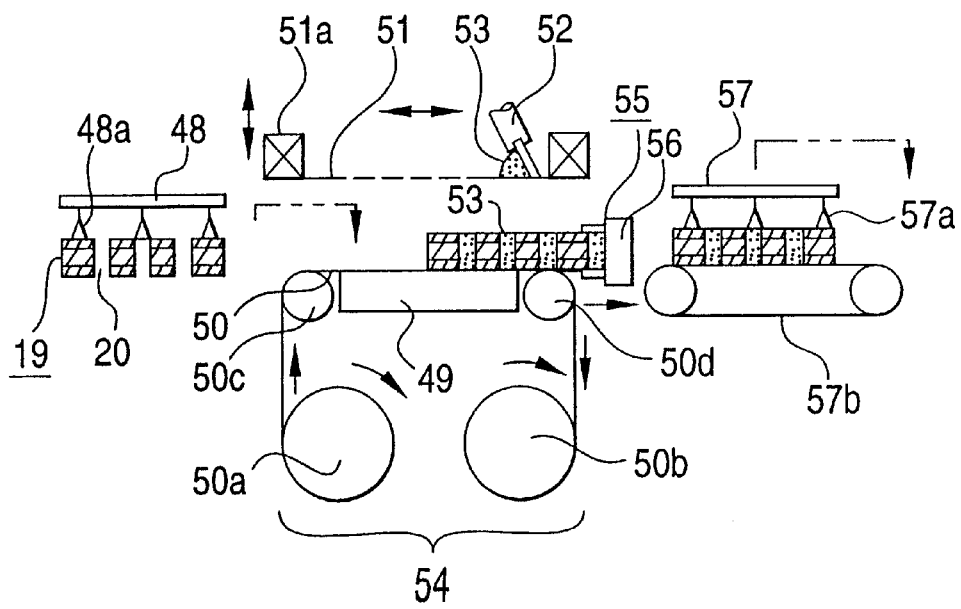
FIG. 6 is a diagram showing the structure of a charging portion according to the first embodiment of the present invention.

FIG. 6 shows the structures of essential portions of the charging portions 3 and 8. Each of the charging portions 3 and 8 incorporates a movable injection loading 48 having an absorber 48a and structured to convey and insert the laminate 19; and a frame portion 51 having, on the upper surface thereof, electrically-conductive paste 53 and squeegee 52 which is able to move horizontally and secured to a frame 51a, the frame portion 51 being capable of moving vertically and formed into a thin-plate-like shape. Moreover, a sheet conveying portion 54 incorporating a supply reel 50a made of resin and arranged to supply a gas-permeable sheet 50, a winding reel 50b, guide rollers 50c and 50d and a printing bed 49 having the gas-permeable sheet 50 slidably disposed on the upper surface thereof is provided. In addition, a shearing and separating portion 55 incorporating a shearing chuck 56 which is capable of moving horizontally, a printing bed 49 which is capable of performing vacuum absorption, a movable ejection loading 57 having an absorber 57a and structured to convey and insert the laminate 19 and a conveying unit 57b, such as a belt conveyor are provided.

The laminate 19 having the holes formed therein is, by the injection loading 48, placed on the gas-permeable sheet 50 disposed on the upper surface of the printing bed 49. Then, the frame portion 51 is moved downward so that the outer portion of the laminate 19 is pressed and held.

When the squeegee 52 is moved horizontally, the electrically-conductive paste 53 is charged into the holes 20 formed in the laminate 19.

After the charging process has been completed, the squeegee 52 is used to move the residual electrically-conductive paste 53 to the upper peripheral portion of the frame portion 51. Then, the frame portion 51 is moved so as to be separated from the laminate 19.

Since the gas-permeable sheet 50 is moved as a result of the operation of the sheet conveying portion 54, the laminate 19 is conveyed while the laminate 19 being placed on the gas-permeable sheet 50.

Therefore, the electrically-conductive paste 53 charged into the holes 20 formed in the laminate 19 is conveyed such that the outer portions of the electrically-conductive paste 53 is surrounded by the holes 20 of the laminate 19 and the lower portions of same are surrounded by the gas-permeable sheet 50.

Then, a portion of the leading end of the laminate 19 is held by a shearing chuck 56 of the shearing and separating portion 55, and then relatively moved in the conveyance direction while the laminate 19 being in contact with the gas-permeable sheet 50. Then, the laminate 19 is separated from the gas-permeable sheet 50.

As a result, adhesion of the electrically-conductive paste 58 to the gas-permeable sheet 50 can be minimized.

Then, the ejection loading 57 is operated to extract the laminate 19 from the charging portions 3 and 8.

Figure 7:
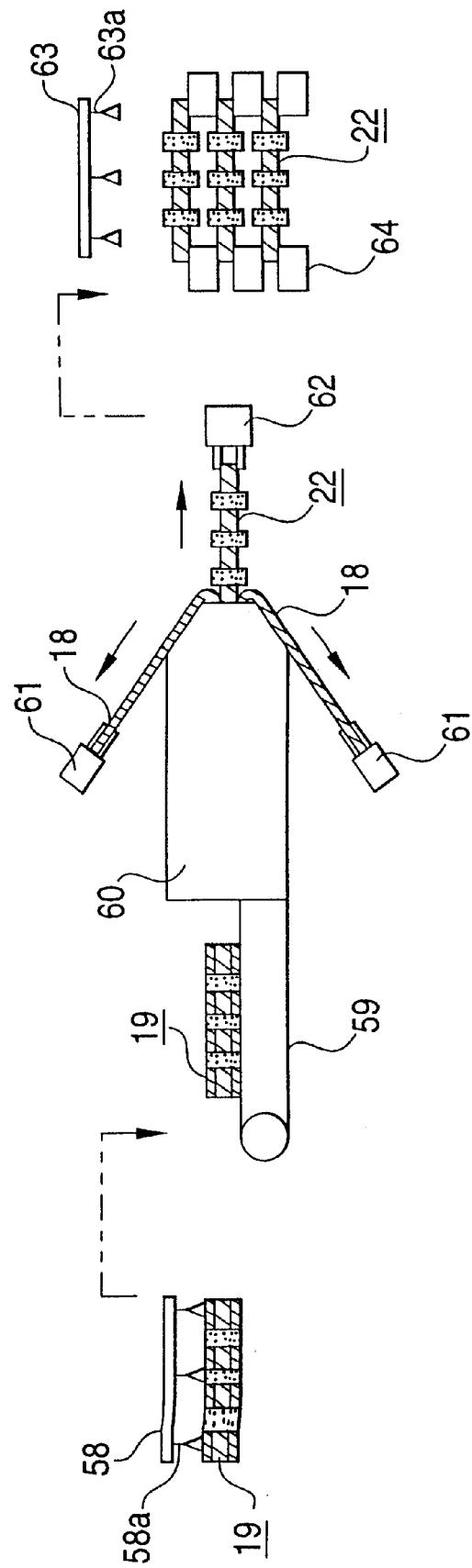
FIG. 7 is a diagram showing the structure of a separating portion according to the first embodiment of the present invention.

FIG. 7 shows the structures of essential portions of the separating portions 4 and 9. Each of the separating portions 4 and 9 incorporates a movable electrically-conductive paste 58 having an absorber 58a and structured to convey and insert the laminate 19; a conveyor 59 made of a heat-resisting material; a heating portion 60 disposed at an end of the conveyor 59 and comprising a circulating and hot furnace or an infrared-ray furnace; a pair of film-member chucks 61 for holding the leading end of the film members 18; a laminate chuck 62 disposed on the outside of an outlet portion of the heating portion 60 and arranged to hold the leading end of the adhesive layer 22; a laminated holding frame 64; and a movable ejection loading 63 having an absorber 63a and structured to convey and insert the laminate 19.

The laminate 19 is injected into the conveyor 59 by injecting loading 58 so as to be placed on the conveyor 59. When the conveyor 59 is operated, the laminate 19 is injected into the heating portion 60 and allowed to pass through the same.

When the laminate 19 is heated to 50° C. to 80° C., the viscosity of the resin in the laminate 19 is lowered. Thus, the film members 18 can easily be separated.

At a position adjacent to the outlet portion of the heating portion 60, portions of the film members 18 in the non-bonded portion 34 at the leading end of the laminate 19 formed by the end-surface cutting portion 38 of the separation-start forming portion are held by the film-member chucks 61 from the two sides of the film members 18. Moreover, the portion of the laminate 19 in the non-bonded portion 34 is held by the laminate chucks 62. Then, the three chucks are moved in three directions so that the laminate 19 is separated into two film members 18 and the adhesive layer 22.

Then, the adhesive layer 22, from which the film members 18 have been separated, is extracted by the ejection loading 63 so as to be alternately stacked by using the holding frame 64.

The holding frame 64 has a structure to hold only the peripheral portion of the adhesive layer 22. Thus, the electrically-conductive paste 53 having viscosity can be held and conveyed while contact of the electrically-conductive paste 53 with another element is being prevented.

Figure 8:
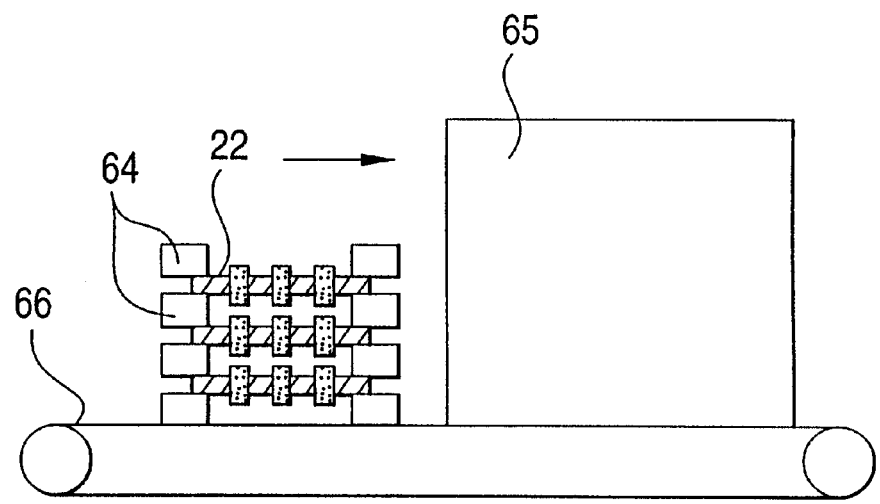
FIG. 8 is a diagram showing the structure of a drying portion according to the first embodiment of the present invention.

FIG. 8 shows the structure of an essential portion of a drying portion following the separating portions 4 and 9. The adhesive layer 22 and the holding frame 64 are alternately stacked, and then introduced into a drying furnace 65 using hot air or infrared rays by a conveyor 66 made of a heat resisting material. Thus, water which causes interlayer separation to take place when the resin is hardened in the following process can be removed.

Figure 9:
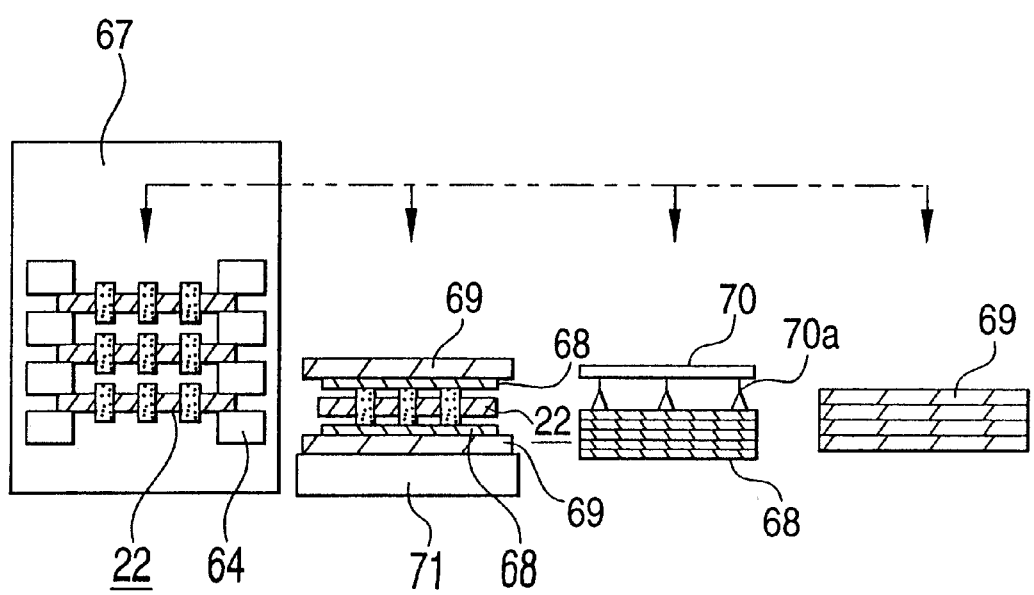
FIG. 9 is a diagram showing the structure of a laminate according to the first embodiment of the present invention.

FIG. 9 shows the structure of an essential portion of the laminating portion 10. The dried adhesive layer 22 is, in a state in which the adhesive layer 22 and the holding frame 64 are alternately stacked, preserved in a moisture preventing portion 67 in which low humidity is maintained, the adhesive layer 22 being preserved for a predetermined period of time immediately before the laminating process is performed.

A movable injection loading 70 having an absorber 70a and structured to perform conveyance and insertion initially places, on a plate 71 made of a metal material or a ceramic material, a pressing plate 69 in the form of a stainless steel plate. Then, electrically-conductive foil 68, which is copper foil or the like, the adhesive layer 22, the electrically-conductive foil 68 and another pressing plate 69 are placed. The above-mentioned placing operation is repeated several times.

Since the adhesive layer 22 is maintained in a low-humidity portion in the moisture preventing portion 67 so that the adhesive layer 22 does not absorb moisture immediately before the laminating process, the adhesive layer 22 does not absorb water which causes interlayer separation when the resin is hardened in the following process.

Figure 10:
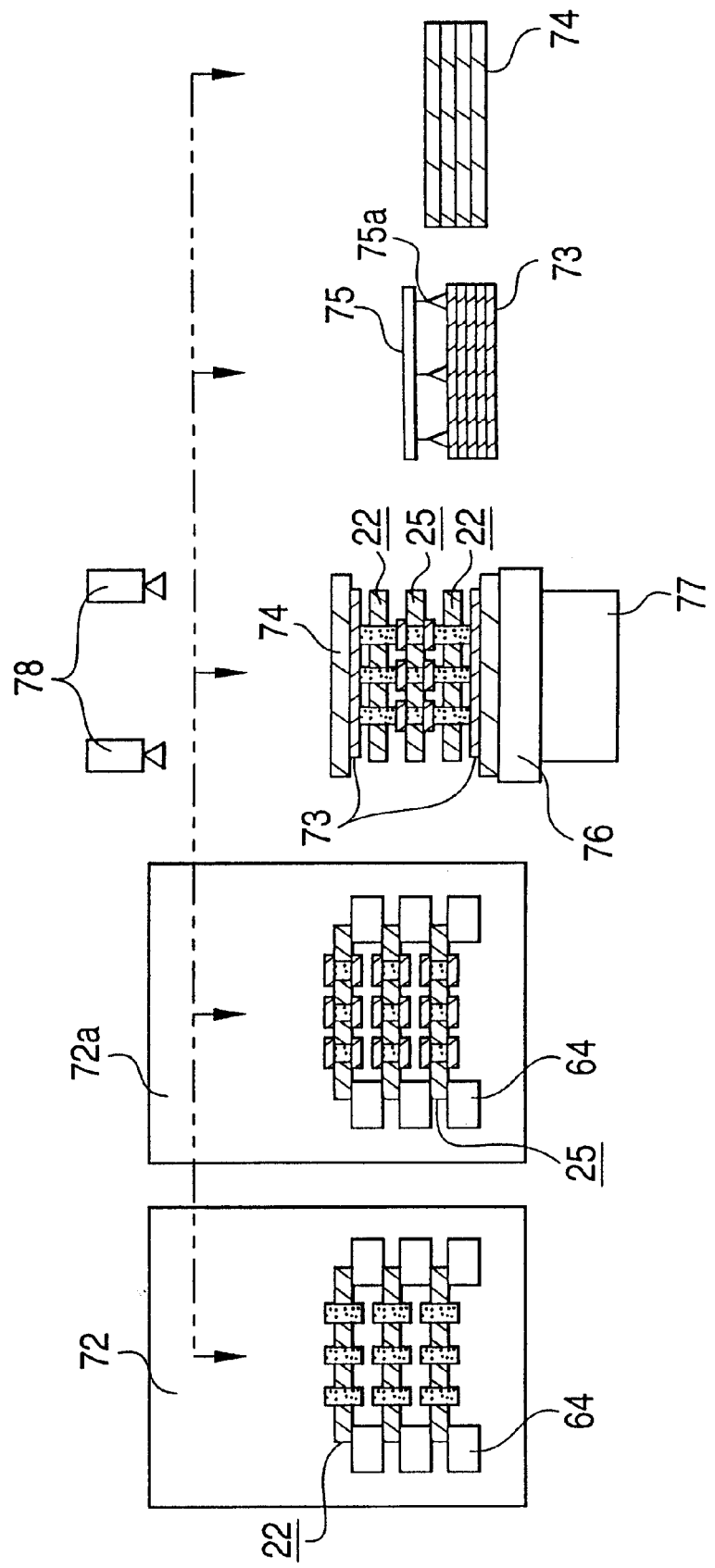
FIG. 10 is a diagram showing the structure of a multilayer laminating portion according to the first embodiment of the present invention.

FIG. 10 shows the structure of an essential portion of the multilayer laminating portion 13. The adhesive layer 22 and the double-sided substrate 25 which have been dried in the previous process and the holding frame 64 are alternately stacked so as to be preserved in the moisture preventing portions 72 and 72a.

A moveable injection loading 75 having an absorber 75a and structured to perform conveyance and insertion initially places a pressing plate 74 in the form of a stainless steel plate on a plate 76 placed on an $XY\theta$-table 77 and made of a metal material or a ceramic material. Then, electrically conductive foil 73, which is copper foil, and the adhesive layer 22 are placed.

Then, an identification mark (not shown) provided for the adhesive layer 22 is detected by a camera 78 disposed at an upper position. Then, an identification mark (not shown) of the double-sided substrate 25 is detected. Then, the $XY\theta$-table 77 is aligned to a position at which alignment to the above-mentioned identification mark is made. Then, the injection loading 75 is operated to laminate the double-sided substrate 25.

Then, the identification mark of the adhesive layer 22 is detected, and then the $XY\theta$-table 77 is aligned to a position at which the alignment to the identification mark of the placed double-sided substrate 25 is made. Then, the injection loading 75 is operated so that the adhesive layer 22 is laminated.

Then, the electrically conductive foil 73 is placed, and then another pressing plate 74 is finally placed. The above-mentioned placing operation is repeated several times.

Since the adhesive layer 22 and the double-sided substrate 25 are preserved in a low-moisture portion so that they do not absorb moisture immediately before they are stacked, water which causes interlayer separation to take place when the resin is hardened in the following process cannot be absorbed.

Then, the processes in the above-mentioned resin hardening portion 14 and the outer-layer-pattern forming portion 15 are performed so that the multilayer substrate 28 is manufactured.

Second Embodiment

Figure 11:
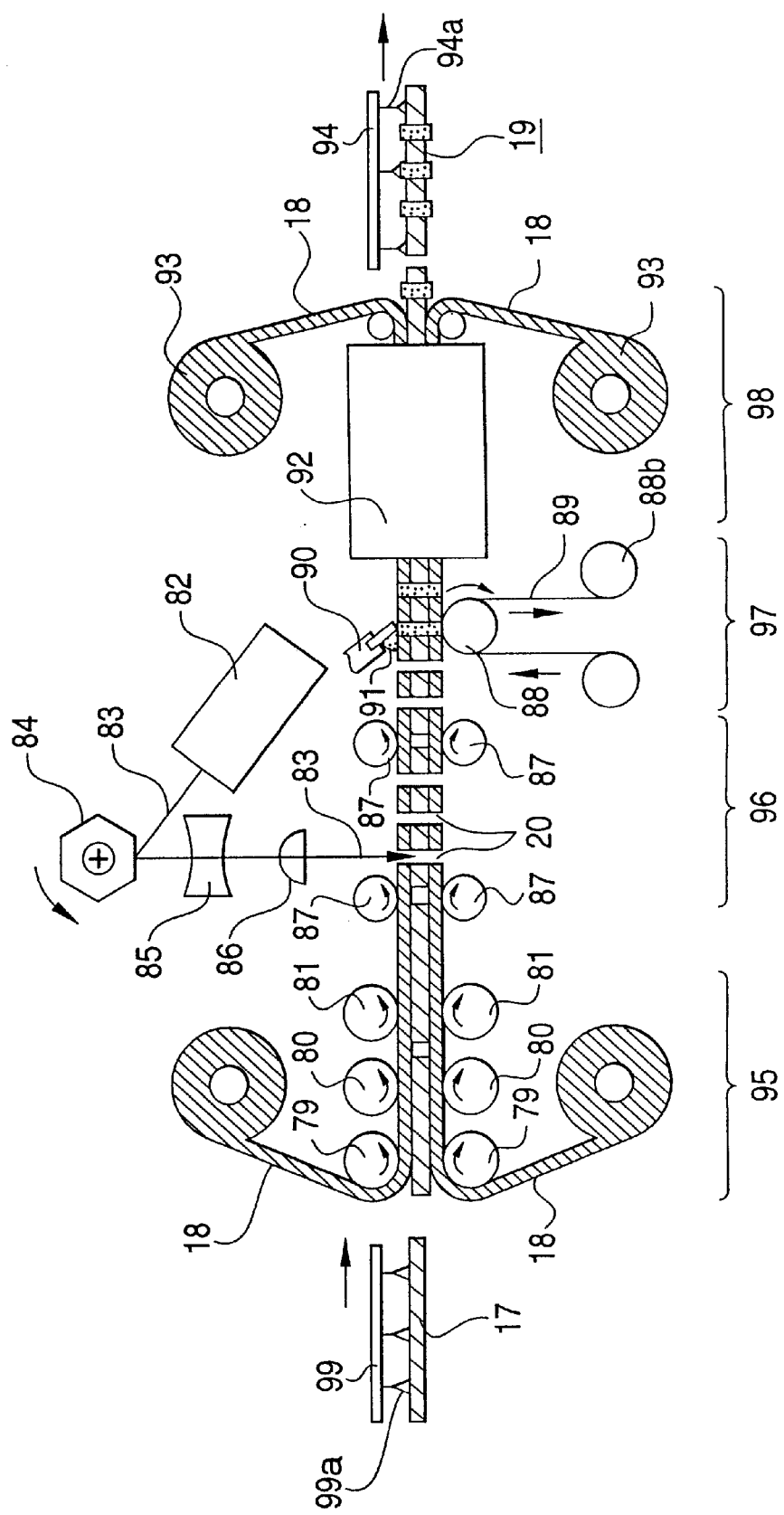
FIG. 11 is a diagram showing the structure of an apparatus for manufacturing an adhesive layer according to a second embodiment of the present invention.
Figure 12:
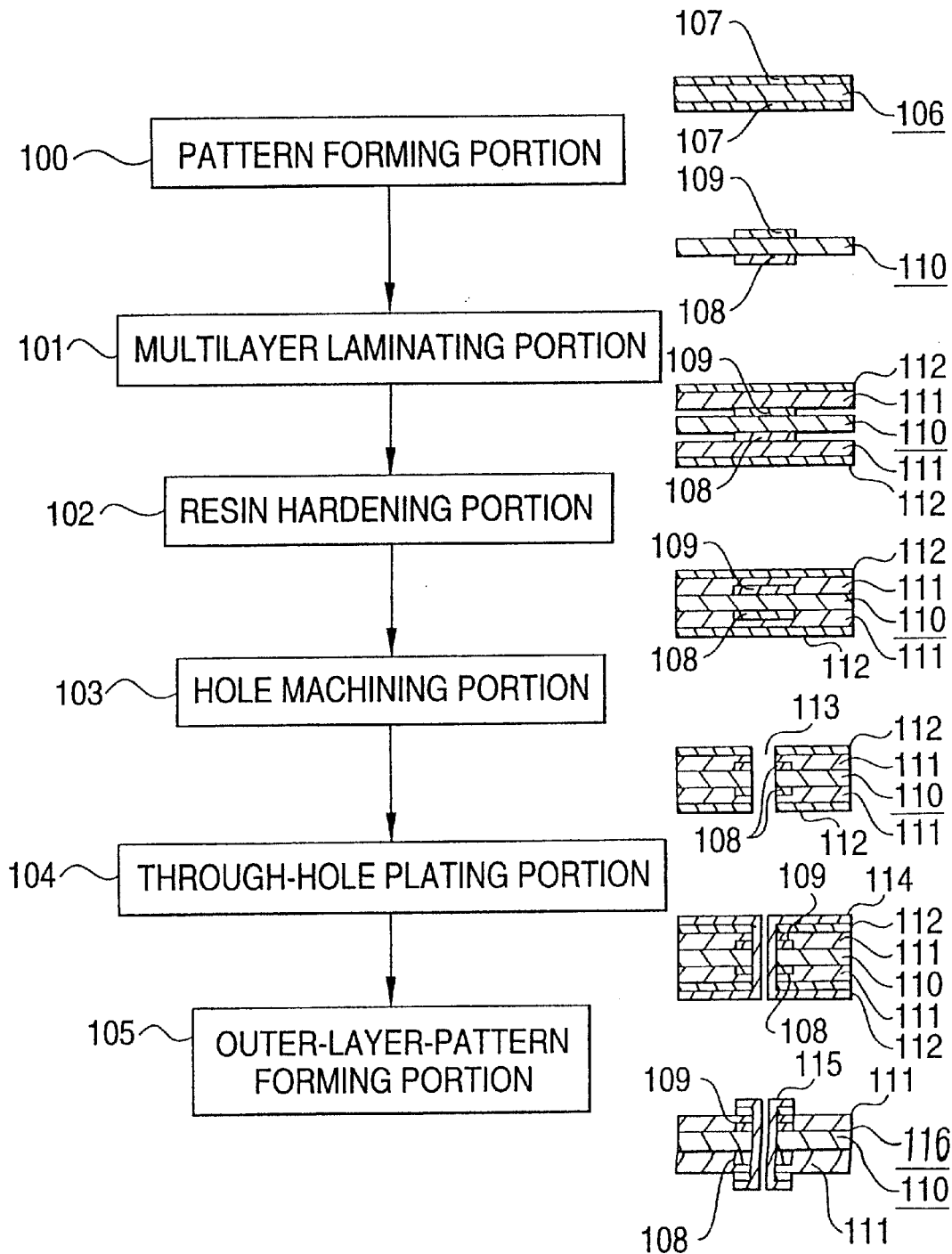
FIG. 12 is diagram showing the overall process which is performed by a conventional apparatus for manufacturing double-sided substrates and multilayer substrates.

FIG. 11 is a diagram showing the structure of an essential portion of an adhesive layer according to a second embodiment of the present invention.

Similarly to the first embodiment, the apparatus incorporates preheating rollers 79, bonding rollers 80 and cooling rollers 81. The preheating rollers 79 and the bonding rollers 80 are heated to 80° C. to 160° C. by a heater incorporating nichrome wire or a heating means using electromagnetic induction, the preheating rollers 79 and the bonding rollers 80 being rotated at predetermined speed.

Film members 18 similar to those according to the first embodiment are supplied and allowed to pass through the above-mentioned pairs of rollers disposed vertically. Prepreg 17 is, similarly to that in the first embodiment, inserted between the film members 18 by a movable injection loading 99 having an absorber 99a and structured to perform conveyance and insertion.

The prepreg 17 and the film members 18 are preheated by the preheating rollers 79, and then heated and pressed by the bonding rollers 80 so as to be bonded to each other. Then, the prepreg 17 and film members 18 are cooled and secured by the pair of the cooling rollers 81 and at the front and rear portions of the cooling rollers 81.

Then, a laser beam 83 emitted from a laser oscillator 82 is scanned by a polygonal mirror 84 which is rotated at high speed, and then allowed to pass through an fθ-lens 85 and a telecentric optical system 86. Thus, the laser beam 83 is converged to a predetermined position of the adhesive layer 19 so that a hole 20 is formed.

When the application of the laser beam 83 and the operation of the pair of the feeding rollers 87 for conveying the adhesive layer 19 are synchronized with each other, the hole forming operation can continuously be performed.

The horizontal movement and operation of a squeegee 90 similar to that according to the above-mentioned embodiment cause electrically-conductive paste 91 to be charged into the holes 20 formed in the adhesive layer 19, which has been conveyed onto roller 88 for a gas permeable sheet 89 fed from a supply reel 88a, wound around a cylindrical roller 88 and arranged to be wound around a winding reel 88b.

Then, the adhesive layer 19 is heated to 50° C. to 80° C. in a heating portion 92 structured similarly to the above-mentioned embodiment so that the viscosity of the resin of the adhesive layer 19 is lowered. Thus, the film members 18 cannot easily be separated. Then, the film members 18 is wound around a pair of winding portion 93. The adhesive layer 19 is extracted by a movable ejection loading 94 having an absorber 94a and structured to perform conveyance and insertion.

Although the above-mentioned description has been made about the structure that the laminate 19 is in the form of sheets, the laminate 19 may be in the form of a continuous member. In the foregoing case, the injection loading 99 and the ejection loading 94 are not required.

If the bonding portion 95, the hole machining portion 96, the charging portion 97 and the separating portion 98 have different processing timing, a buffer, such as a dancer roller, may be disposed among the processes.

Industrial Applicability

As described above, according to the present invention, an apparatus for manufacturing a double-sided substrate and a multilayer substrate can be provided which has a fine and clean manufacturing process, which exhibits an excellent mounting efficiency and which does not require a plating process, and an apparatus for manufacturing an adhesive layer for use in the above-mentioned substrates can be provided.

What is claimed is:

1. An apparatus for manufacturing an adhesive layer, comprising:
   a bonding portion for bonding a film member to prepreg;
   a hole machining portion for forming a hole at a predetermined position of a laminate composed of the prepreg and the film member;
   a charging portion for charging electrically-conductive paste into the formed hole in the laminate which is composed of the prepreg and the film member; and
   a separating portion for separating the film member from the laminate having the hole into which the electrically-conductive paste has been charged,
   wherein said bonding portion incorporates a separation-start forming portion for separating a portion of a side of the film member from the laminate composed of the prepreg and the film member so as to form a non-bonded portion.

2. An apparatus for manufacturing an adhesive layer, comprising:
   a bonding portion for bonding a film member to prepreg;
   a hole machining portion for forming a hole at a predetermined position of a laminate composed of the prepreg and the film member;
   a charging portion for charging electrically-conductive paste into the formed hole in the laminate which is composed of the prepreg and the film member, wherein said charging portion incorporates a printing bed, a sheet conveying portion, and a shearing portion, said printing bed being capable of performing vacuum adsorption, said sheet conveying portion being adapted to convey the laminate placed through a gas-permeable sheet on said printing bed by conveying said gas-permeable sheet, said shearing portion being adapted to shear and separate the laminate in a state in which contact surfaces of the laminate and the gas-permeable sheet are maintained in contact; and
   a separating portion for separating the film member from the laminate having the hole into which the electrically-conductive paste has been charged.

3. An apparatus for manufacturing an adhesive layer according to claim 2, wherein said bonding portion incorporates a preheating portion for preheating the prepreg and the film member, a heating portion for bonding the prepreg and the film member to each other and a cooling portion for cooling and securing the prepreg and the film member.

4. An apparatus for manufacturing an adhesive layer according to claim 2, wherein said bonding portion incorporates a cutting portion for cutting the laminate into sheets after the prepreg and the film member have been boded to each other.

5. An apparatus for manufacturing an adhesive layer according to claim 2, wherein said bonding portion incorporates, in the final portion thereof, an end-surface cutting portion for cutting a portion of an end surface of the laminate composed of the prepreg and the film member.

6. An apparatus for manufacturing an adhesive layer according to claim 2, wherein said charging portion incorporates a squeegee and a frame portion for holding the periphery of the laminate.

7. An apparatus for manufacturing an adhesive layer according to claim 2, wherein said separating portion for separating the film member from the laminate having the hole into which the electrically-conductive paste has been charged incorporates a heating portion.

8. An apparatus for manufacturing an adhesive layer according to claim 2, further comprising a holding frame for alternately stacking the laminates each having the hole into which the electrically-conductive paste has been charged or the adhesive layers each of which is obtained by separating the film member from the laminate having the hole into which the electrically-conductive paste has been charged so as to hold and convey the laminates or the adhesive layers.

9. An apparatus for manufacturing a double-sided substrate, comprising:
   a bonding portion for bonding a film member to prepreg;
   a hole machining portion for forming a hole at a predetermined position of a laminate composed of the prepreg and the film member;
   a charging portion for charging electrically-conductive paste into the formed hole in the laminate which is composed of the prepreg and the film member;

a separating portion for separating the film member from the laminate having the hole into which the electrically-conductive paste has been charged;

a laminating portion for laminating electrically-conductive foil to two sides of the adhesive layer from which the film member has been separated;

a resin hardening Portion for hardening resin of the adhesive layer; and a pattern forming portion for forming a predetermined electrically-conductive patter on the electrically-conductive foil, wherein said bonding portion incorporates a separation-start forming portion for separating a portion of a side of the film member from the laminate composed of the prepreg and the film member so as to form a non-bonded portion.

10. An apparatus for manufacturing a double-sided substrate, comprising:

a bonding portion for bonding a film member to prepreg;

a hole machining portion for forming a hole at a predetermined position of a laminate composed of the prepreg and the film member;

a charging portion for charging electrically-conductive paste into the formed hole in the laminate which is composed of the prepreg and the film member, wherein said charging portion incorporates a printing bed, a sheet conveying portion, and a shearing portion, said printing bed being adapted to perform vacuum adsorption, said sheet conveying portion being adapted to convey the laminate placed through a gas-permeable sheet on said printing bed by conveying said gas-permeable sheet, said shearing portion being adapted to shear and separate the laminate in a state in which contact surfaces of the laminate and the gas-permeable sheet are maintained in contact;

a separating portion for separating the film member from the laminate having the hole into which the electrically-conductive paste has been charged;

a laminating portion for laminating electrically-conductive foil to two sides of the adhesive layer from which the film member has been separated;

a resin hardening portion for hardening resin of the adhesive layer; and a pattern forming portion for forming a predetermined electrically-conductive patter on the electrically-conductive foil.

11. An apparatus for manufacturing a double-sided substrate according to claim 10, wherein said bonding portion incorporates a preheating portion for preheating the prepreg and the film member, a heating portion for bonding the prepreg and the film member to each other and a cooling portion for cooling and securing the prepreg and the film member.

12. An apparatus for manufacturing a double-sided substrate according to claim 10, wherein said bonding portion incorporates a cutting portion for cutting the laminate into sheets after the prepreg and the film member have been boded to each other.

13. An apparatus for manufacturing a double-sided substrate according to claim 10, wherein said bonding portion incorporates, in the final portion thereof, an end-surface cutting portion for cutting a portion of an end surface of the laminate composed of the prepreg and the film member.

14. An apparatus for manufacturing a double-sided substrate according to claim 10, wherein said charging portion incorporates a squeegee and a frame portion for holding the periphery of the laminate.

15. An apparatus for manufacturing a double-sided substrate according to claim 10, wherein said separating portion for separating the film member from the laminate having the hole into which the electrically-conductive paste has been charged incorporates a heating portion.

16. An apparatus for manufacturing a double-sided substrate according to claim 10, further comprising a holding frame for alternately stacking the laminates each having the hole into which the electrically-conductive paste has been charged or the adhesive layers each of which is obtained by separating the film member from the laminate having the hole into which the electrically-conductive paste has been charged so as to hold and convey the laminates or the adhesive layers.

17. An apparatus for manufacturing a double-sided substrate according to claim 10, further comprising a drying portion for removing water from the adhesive layer from which the film member has been separated.

18. An apparatus for manufacturing a double-sided substrate according to claim 10, wherein said laminating portion has a moisture absorption preventive portion for causing the adhesive layer, from which the film member has been separated, not to absorb moisture.

19. An apparatus for manufacturing a multilayer substrate, comprising a double-sided-substrate forming portion incorporating a bonding portion for bonding a film member to prepreg;

a hole machining portion for forming a hole at a predetermined position of a laminate composed of the prepreg and the film member;

a charging portion for charging electrically-conductive paste into the formed hole in the laminate which is composed of the prepreg and the film member;

a separating portion for separating the film member from the laminate having the hole into which the electrically-conductive paste has been charged;

a laminating portion for laminating electrically-conductive foil to two sides of the adhesive layer from which the film member has been separated;

a resin hardening portion for hardening resin of the adhesive layer;

a pattern forming portion for forming a predetermined electrically-conductive pattern on the electrically-conductive foil;

a multilayer-substrate forming portion for bonding other double-sided substrates or electrically-conductive foil to the two sides of said double-sided substrate through the adhesive layers;

a resin hardening portion for hardening resin of the adhesive layer; and an outer-later-pattern forming portion for forming a predetermined electrically-conductive pattern on the electrically-conductive foil bonded to the outermost layer;

wherein said bonding portion incorporates a separation-start forming portion for separating a portion of a side of the film member from the laminate composed of the prepreg and the film member so as to form a non-bonded portion.

20. An apparatus for manufacturing a multilayer substrate, comprising:

a double-sided-substrate forming portion incorporating a bonding portion for bonding a film member to prepreg;

a hole machining portion for forming a hole at a predetermined position of a laminate composed of the prepreg and the film member;

a charging portion for charging electrically-conductive paste into the formed hole in the laminate which is composed of the prepreg and the film member, wherein said charging portion incorporates a printing bed, a sheet conveying portion, and a shearing portion, said printing bed being adapted to perform vacuum adsorption, said sheet conveying portion being adapted to convey the laminate placed through a gas-permeable sheet on said printing bed by conveying said gas-permeable sheet, said shearing and portion being adapted to shear and separate the laminate in a state in which contact surfaces of the laminate and the gas-permeable sheet are maintained in contact;

a separating portion for separating the film member from the laminate having the hole into which the electrically-conductive paste has been charged;

a laminating portion for laminating electrically-conductive foil to two sides of the adhesive layer from which the film member has been separated;

a resin hardening portion for hardening resin of the adhesive layer; and, pattern forming portion for forming a predetermined electrically-conductive pattern on the electrically-conductive foil;

a multilayer-substrate forming portion for bonding other double-sided substrates or electrically-conductive foil to the two sides of said double-sided substrate through the adhesive layers;

a resin hardening portion for hardening resin of the adhesive layer; and an outer-later-pattern forming portion for forming a predetermined electrically-conductive pattern on the electrically-conductive foil bonded to the outermost layer.

21. An apparatus for manufacturing a multilayer substrate according to claim 20, wherein said bonding portion incorporates a preheating portion for preheating the prepreg and the film member, a heating portion for bonding the prepreg and the film member to each other and a cooling portion for cooling and securing the prepreg and the film member.

22. An apparatus for manufacturing a multilayer substrate according to claim 20, wherein said bonding portion incorporates a cutting portion for cutting the laminate into sheets after the prepreg and the film member have been boded to each other.

23. An apparatus for manufacturing a multilayer substrate according to claim 20, wherein said bonding portion incorporates, in the final portion thereof, an end-surface cutting portion for cutting a portion of an end surface of the laminate composed of the prepreg and the film member.

24. An apparatus for manufacturing a multilayer substrate according to claim 20, wherein said charging portion incorporates a squeegee and a frame portion for holding the periphery of the laminate.

25. An apparatus for manufacturing a multilayer substrate according to claim 20, wherein said separating portion for separating the film member from the laminate having the hole into which the electrically-conductive paste has been charged incorporates a heating portion.

26. An apparatus for manufacturing a multilayer substrate according to claim 20, further comprising a holding frame for alternately stacking the laminates each having the hole into which the electrically-conductive paste has been charged or the adhesive layers each of which is obtained by separating the film member from the laminate having the hole into which the electrically-conductive paste has been charged so as to hold and convey the laminates or the adhesive layers.

27. An apparatus for manufacturing a multilayer substrate according to claim 20, further comprising a drying portion for removing water from the adhesive layer from which the film member has been separated or the double-sided substrate.

28. An apparatus for manufacturing a multilayer substrate according to claim 20, wherein said laminating portion or said multilayer laminating portion has a moisture absorption preventive portion for causing the adhesive layer, from which the film member has been separated, or the double-sided substrate not to absorb moisture.

* * * * *